US008374603B2

(12) United States Patent
Klein et al.

(10) Patent No.: US 8,374,603 B2
(45) Date of Patent: Feb. 12, 2013

(54) METHOD FOR UTILIZING AN ADAPTIVE CONVENTIONAL SCANNING ALGORITHM IN A TWO-WAY RADIO TRANSCEIVER

(75) Inventors: David E. Klein, Davie, FL (US); Andrew J. Janecek, Tamarac, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 807 days.

(21) Appl. No.: 11/380,904

(22) Filed: Apr. 28, 2006

(65) Prior Publication Data

US 2007/0254649 A1  Nov. 1, 2007

(51) Int. Cl.
*H04W 4/00* (2009.01)
*H04B 1/18* (2006.01)

(52) U.S. Cl. .................. 455/434; 455/161.1; 455/166.2
(58) Field of Classification Search .................. 455/434
See application file for complete search history.

(56) References Cited

U.S. PATENT DOCUMENTS

| 5,214,790 A | | 5/1993 | Kozlowski et al. |
| 5,517,677 A | | 5/1996 | Moon |
| 5,806,002 A | * | 9/1998 | Wiatrowski et al. .......... 455/512 |
| 5,864,752 A | * | 1/1999 | Pinder ....................... 455/161.3 |
| 2006/0274714 A1 | * | 12/2006 | Chowdhary et al. .......... 370/347 |

FOREIGN PATENT DOCUMENTS

| WO | 2007127626 A2 | 11/2007 |
| WO | 2007127626 A3 | 11/2007 |

OTHER PUBLICATIONS

PCT International Search Report Application No. PCT/US07/66597 Dated Aug. 19, 2008—6 Pages.
PCT International Preliminary Examination Report Application No. PCT/US2007/066597—Dated Nov. 6, 2008—6 Pages.
PCT International Article 19 Amendment Application No. PCT/US2007/066597—Dated Sep. 5, 2008—9 Pages.
Office Action mailed on Feb. 24, 2010 in counterpart Australian Patent Application No. 2007242980.
Office Action dated Feb. 25, 2011 in counterpart Canadian Patent Application No. 2649908.

* cited by examiner

*Primary Examiner* — Huy C Ho
(74) *Attorney, Agent, or Firm* — Barbara R. Doutre

(57) ABSTRACT

A method for adaptive conventional scanning in a two-way radio transceiver (300) includes initiating an unweighted scan behavior (301) from a scanning list and then determining if qualified activity is present on a scanned channel (303) for a predetermined number of scan cycles. Once qualified activity is detected, the scanned channel is then marked (307) as having high activity. The transceiver then switches (309) to a weighted scan behavior such that the marked channel will be checked at a higher periodic rate than an unmarked channel. Once qualified activity is detected on the marked channel for a predetermined number of cycles (311) the channel is unmarked (315) and the weighted nature of the scan is removed such that normal scanning activity is resumed (317). The marking process increases the overall scanning rate enhancing the overall performance of the scan for all channels.

8 Claims, 4 Drawing Sheets

METHOD FOR UTILIZING AN ADAPTIVE CONVENTIONAL SCANNING ALGORITHM IN A TWO-WAY RADIO TRANSCEIVER

FIELD OF THE INVENTION

The present invention relates generally to a method for scanning radio frequencies in a two-way radio transceiver and more particularly to adaptive scanning techniques for optimizing the scan based upon voice traffic.

BACKGROUND

Radio frequency (RF) scanning techniques are well known in the art allowing a two-way radio transceiver to scan a plurality of channelized frequencies in order to detect voice and/or data traffic on a channel. The original concept of channel scanning was to loop through a list of channels in order to check for activity. In the realm of public safety two-way radio communications, first responders work on a basic deployment system via a dispatcher where public safety personnel typically hear any communications by the dispatcher. This requirement has led to a "priority" type channel scan such that even if the transceiver receives audio communications from a different channel, it would always revert back to the dispatcher channel to ensure there is no activity.

The problem with this "priority scan" technique, especially on the conventional analog radio products, is that users desire to place a different importance on the priority channel. There are currently two types of priority scans utilized in the prior art. The priority scan technique in many analog products provides for a loop through the scan list where extra time is spent only looking back at the priority channel once the channel is unmuted on a non-priority channel. This type of approach means that the priority channel is scanned an equal amount as any other channel and only gets extra scan time once the transceiver is unmuted on a different channel. Similarly, the second type of priority scan that is utilized on many digital radio products provides a method where the scan loops or cycles through a scan list and then checks the priority channel after each individualized channel scan. Thus, using this method, the priority channel is scanned 50% of the time which will take the transceiver longer to move through the scan list. Moreover, there is an increased chance of "audio holes," which are situations where the user misses audio on a non-priority channel since the scan misses audio segments as the receiver jumps from channel to channel.

Prior art FIG. 1 represents the first priority scanning process where the scanning method 100 is initiated 101 and a determination is made if channel activity 103 is present on a scanned channel. Qualified activity is defined as that threshold of activity such as voice or data traffic defined by the user that is intended for receipt while unqualified activity is not intended for receipt. If non-qualified activity is identified 105, then the radio will need to identify if the same channel has had unqualified activity for at least a predetermined number of scanning cycles or loops 119. Then the scanning algorithm will mark the channel such that the scan algorithm will not try to identify qualified activity until no activity is detected on the channel, y number of seconds, or z number of loops 115 through the scan list as it continues the normal unweighted scan 117. If qualified activity is identified 105, then the radio will unmute to the channel 121. Once unmuted to the active channel, the radio also checks for activity on a priority channel 107. If the priority channel has qualified activity 109 then the radio will switch to the priority channel and not start until the call or communications ends 113. If qualified activity is not detected, the transceiver continues unmuting to the channel until the call has ended or the priority channel has qualified activity. Thereafter, the unweighted (unmarked) channel behavior is continued 117 and the process starts over 101.

The second priority scanning process is shown in prior art FIG. 2 and utilizes a statically weighted priority scanning behavior where priority channel(s) are statically defined and their weight does not change during the scanning process. The radio loops through a scan list in an alternating format such that every other channel that is scanned is the priority channel. This effectively weights the priority channel(s) to 50% of the scanning activity. This behavior does not change based on channel activity. Like the priority scanning behavior noted above, this constant checking back to a priority channel causes the audio holes in the received audio. The flow chart illustrates the process 200 where the scanning process begins 201 and the priority channel is scanned followed by the first channel, then the priority channel, the second channel and then the priority channel etc. 203. If qualified activity is detected on a non-priority channel 205, the non-priority channel is unmuted 207. If the priority channel has qualified activity 209 then the radio switches from the previously unmuted channel to the priority channel and un-mutes and discontinues scanning 211. Scanning is initiated 213 when the call is completed. Thereafter, scanning sequence is again initiated 203. If non-qualified activity is detected on the priority channel while qualified activity exists on a non-priority channel 209, the radio continues the priority weighted scan behavior 215 and un-mutes to the non-priority channel 207. In the event where no qualified activity is detected on the non-priority channel 205, then the channel is marked as having unqualified activity until the carrier is no longer present, a predetermined time period has expired, or a predetermined number of loops through the scan list 217, and the radio continues the priority weighted scan behavior. Thereafter, the scanning process begins anew 201. Both of these scan solutions are well known; however, neither fully meets market needs in view of the possibility of missing priority information in the first process or the presence of audio holes left by continually cycling back to the priority channel in the second process.

Consequently, the need exists to provide for a scanning technique that will not only effectively scan through a channel list in a timely manner but will also be able to check for traffic on priority channels with reduced priority channel effects like voice holes or the like. The new process should utilize these concepts to adaptively adjust the scanning behavior based upon audio traffic.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
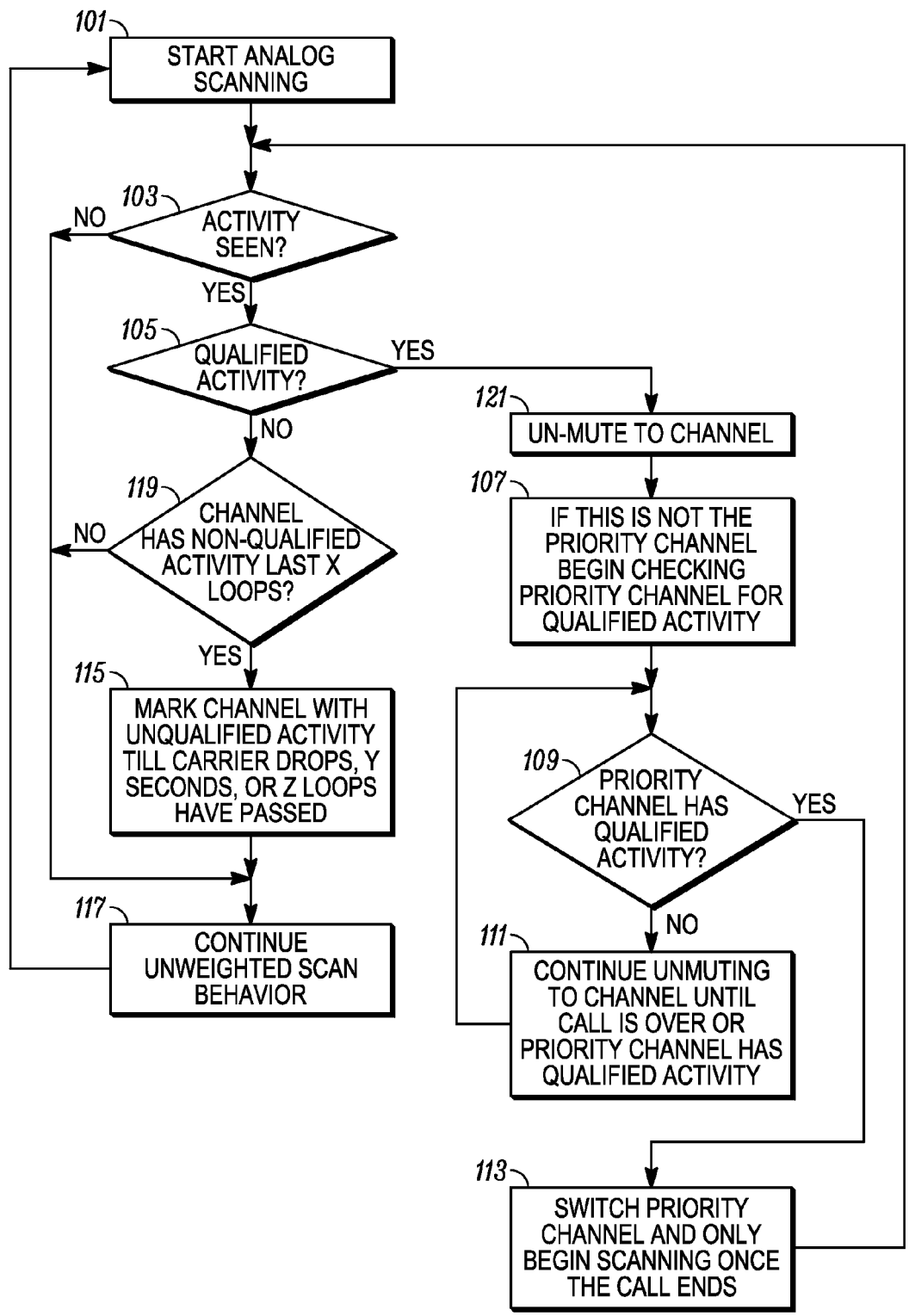
FIG. 1 is a prior art flow chart diagram illustrating a typical scanning method used in analog radio transceiver products.
Figure 2:
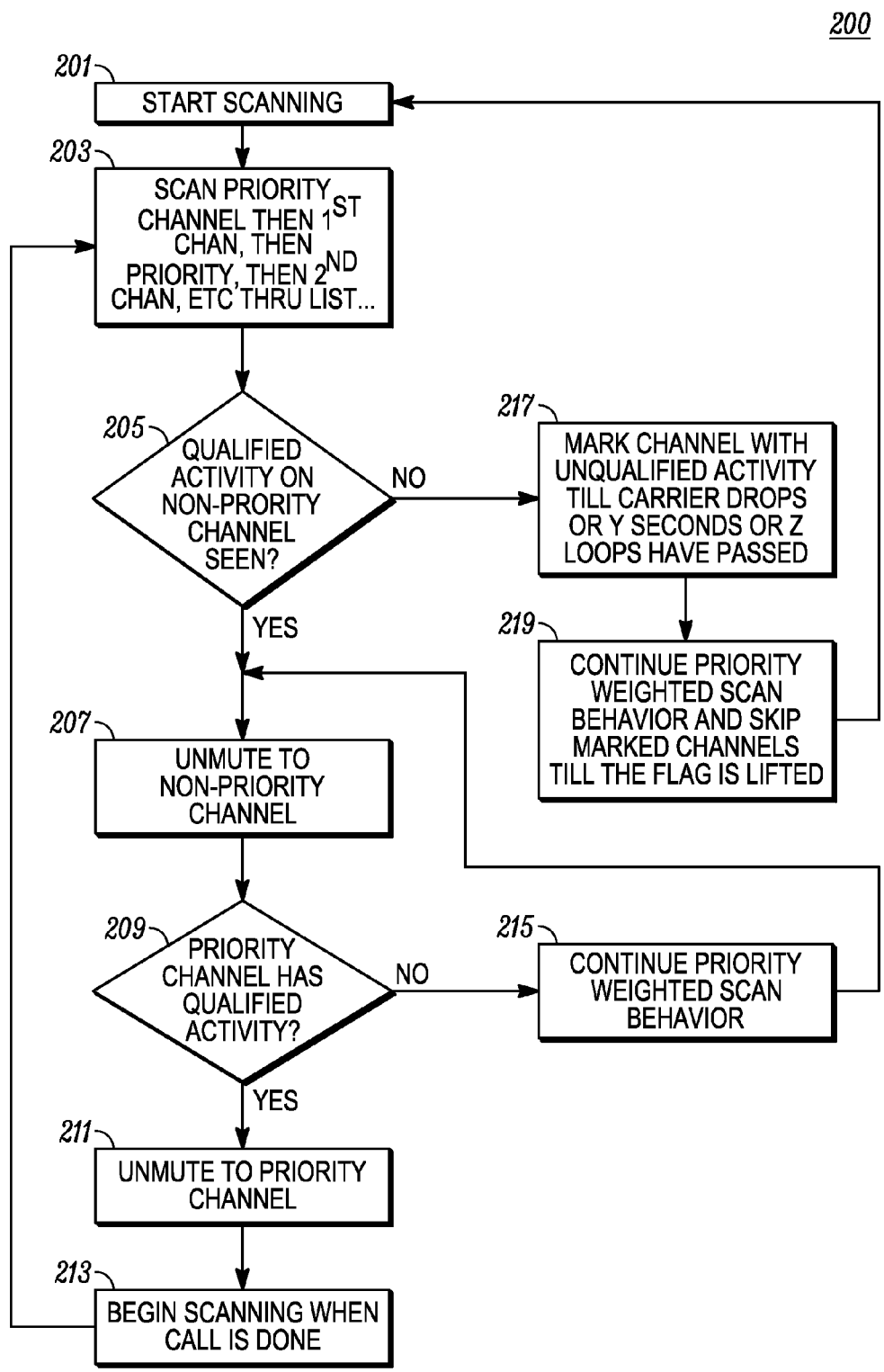
FIG. 2 is a prior art flow chart diagram illustrating a prior art scanning technique where a priority channel is continually checked for activity while moving through a list of scanned channels.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps for utilizing an adaptive conventional scanning algorithm. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of an adaptive conventional scanning algorithm described herein. The non-processor circuits may include, but are not limited to, a radio receiver, a radio transmitter, signal drivers, clock circuits, power source circuits, and user input devices. As such, these functions may be interpreted as steps of a method to perform adaptive conventional scanning algorithm. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The present invention is a method utilizing an adaptive conventional scanning algorithm where the adaptive nature of the method optimizes the performance of scan based upon the current voice traffic on the priority channel. The method allows the scanning algorithm to acknowledge that a particular channel has had qualified activity over a given threshold and therefore should be considered a "high activity channel." Once a channel becomes a high activity channel, the radio transceiver can then begin to "weight" the channel (or channels in a dual priority approach) based on user preference. This channel weighting is fully configurable or may be used in connection with a preconfigured secondary weighting scheme. As the activity subsides on the high activity channel, the radio can remove the high activity indication and the radio can revert to an unweighted non-priority scan.

At the same time the high activity channel analysis is occurring, the radio will also utilize channel markers to mark non-qualified activity during normal scan loops. This is similar to the current scan used in many analog products; however, this occurs when the radio is not unmuted and applies to all of the channels (except the high activity channel). This marking will increase the scanning speed in general, whether there is a high activity channel marked or not. So, the overall performance of scan will be increased for all channels. This methodology supports a conventional scan operation, but the philosophy is applicable to mixed conventional and trunking algorithms given that the adaptive nature is based strictly upon channel activity.

Figure 3:
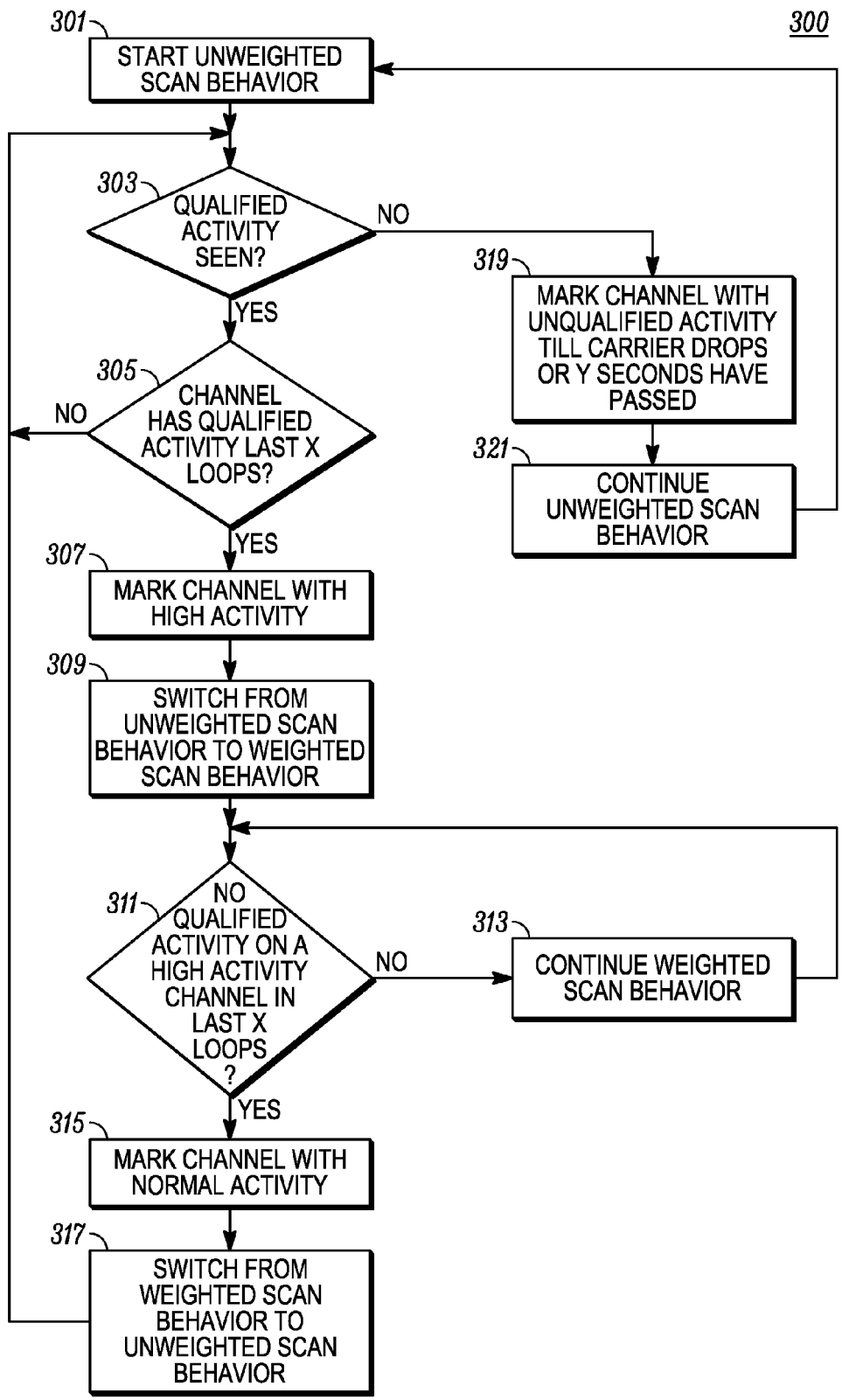
FIG. 3 is a flow chart diagram illustrating a new scanning technique in accordance with an embodiment of the invention.

FIG. 3 is a flow chart diagram illustrating the new scanning technique 300 in accordance with an embodiment of the invention where unweighted scan behavior is started 301 and a determination is made if there is any qualified activity that is present 303 on a channel during the scan. If qualified activity is present and the channel has qualified activity for a predetermined number of loops through the scan cycle 305, the channel is marked 307 as having "high" activity. This switches the scan behavior from an unweighted scan to a weighted scan behavior 309. If a high activity channel has seen qualified activity in the last predetermined number of loops 311 then the weighted scan behavior is continued 313. If a high activity channel does not have qualified activity in the last number of predetermined scanning loops then the channel is marked as having "normal" activity 315. The scan is switched from weighted scan behavior to unweighted scan behavior 317.

As with the prior art, if non-qualified activity is seen after start of the unweighted scan behavior 303, then the channel is marked as having unqualified activity until the carrier drops, i.e., no signal is present on the channel, a predetermined time period has expired, or loops through the scan list 319. Thereafter, unweighted scan behavior is continued 321 until some qualified activity has lasted a predetermined number of scanning loops 305.

Figure 4:
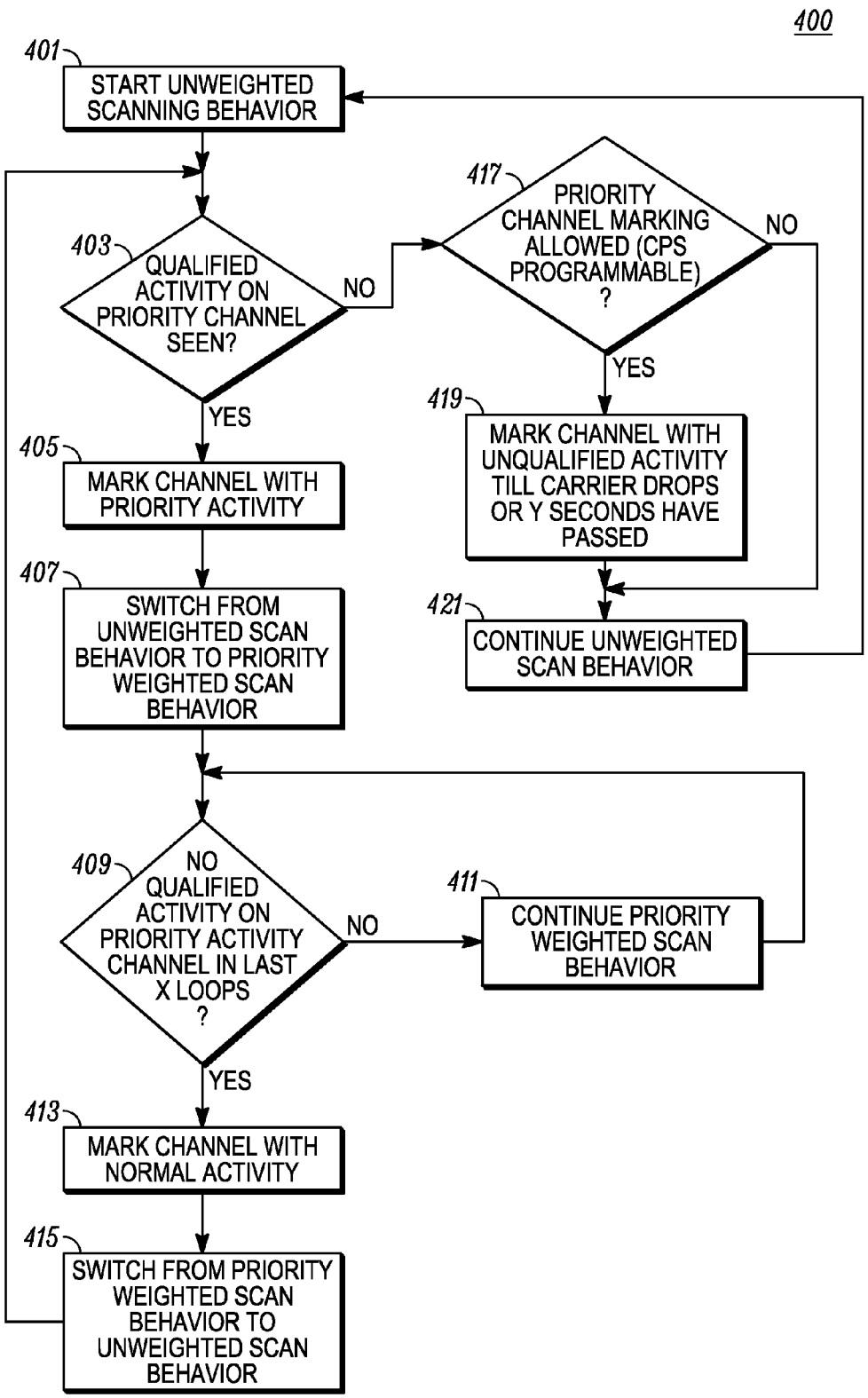
FIG. 4 is a flow chart diagram illustrating a new scanning technique in accordance with yet another embodiment of the invention.

FIG. 4 is a flow chart diagram illustrating a new scanning technique 400 in accordance with yet another embodiment of the invention where an unweighted scan behavior is started 401 and a determination is made if qualified activity on a priority channel is detected 403. If qualified activity is detected, the scanned channel is marked 405 as having priority activity and the scan is switched from an unweighted scan behavior to a priority weighted scan behavior 407. If the priority activity channel continues to have qualified activity 409 then the priority weighted scan behavior is continued 411. If the priority activity channel has no qualified activity detected for a predetermined time period or number of scan loops then the channel is marked has having normal activity 413 and the scan behavior is switched from the priority weighted scan to the unweighted scan behavior 415. As noted in the prior art, if no qualified activity is initially detected on the priority channel 403 and priority channel marking is permitted 417 then the channel is marked as having unqualified activity until the carrier drops, i.e., no signal is present or until a predetermined number of seconds have passed or loops through the scan list 419. Thereafter, the unweighted scan behavior is continued 421, and the unweighted scan is started again 401.

Thus, these adaptive processes allow the priority scanning algorithm to acknowledge that a priority channel has had qualified activity (i.e. levels of activity that are specified as "high activity") and therefore should be considered a channel with priority activity. Once a priority channel is marked with priority activity, the radio transceiver can start to weight the channel (or channels in a dual priority approach) in the scan list. This weighting is fully configurable, or a secondary weighting scheme can be used. In one embodiment, the method operates like a typical transceiver's scanning technique where the priority channel receives 50% of the scan duty cycle; however, every other channel checked could be the priority channel. During the same time as the priority activity channel analysis, the radio transceiver utilizes channel markers to mark non-qualified activity during normal scan loops. This is similar to the scan noted in the prior art; however, this occurs when the radio is not unmuted and applies to all of the channels (except the priority channel). This marking will increase the scanning speed in general, whether or not there is a priority activity channel marked. Therefore, the overall performance of scan will be increased for all channels. This methodology supports conventional scan operation, but the philosophy is applicable to mixed conventional and trunking algorithms given that the adaptive nature is based strictly upon channel activity.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A method for adaptive conventional scanning in a two-way radio transceiver comprising the steps of:
   initiating an unweighted scan behavior from a scanning list;
   determining if qualified activity is present on the scanned channel for a predetermined number of scan cycles, wherein the predetermined number of scan cycles is set for determining a threshold of qualified activity;
   marking the scanned channel as having high activity in response to determining that the threshold of qualified activity is present over the predetermined number of scan cycles;
   switching to a weight scan behavior such that a marked channel will be scanned at a higher periodic rate than an unmarked channel, the weight scan behavior being user configurable;
   adjusting the predetermined number of scan cycles based on the marking in order to prevent the occurrence of audio holes during the scanning process; and
   switching to the unweighted scan behavior on a non-priority channel and removing the high activity marker in response to the qualified activity subsiding on the high activity channel.

2. A method for adaptive conventional scanning as in claim 1, further comprising the step of:
   continuing the weighted scan behavior until no qualified activity has been detected in a predetermined number of scan cycles.

3. A method for utilizing an adaptive scanning technique for optimizing the performance of the scan based upon current voice traffic on a priority channel in a two-way radio transceiver comprising the steps of:
   marking that a priority channel is a high activity channel based upon detection of activity on the channel over a predetermined number of scan cycles;
   weighting the high activity channel based on qualified activity detected on the channel, wherein the weighting of the high activity channel is user selectable;
   adjusting the weighting based on the marking to minimize audio holes in the received audio of the two-way radio transceiver; and
   removing the marker from the high activity channel if the qualified activity on the high activity channel drops below a predetermined threshold.

4. A method for utilizing an adaptive scanning technique as in claim 3, further comprising the step of:
   adjusting the weighting to control the rate upon which channels that are not marked are scanned.

5. A method for utilizing an adaptive scanning technique as in claim 3, further comprising the step of:
   utilizing channel markers to mark non-qualified channel activity during a scanning loop for all channels other than a high activity channel for increasing the rate of scan.

6. A method for adaptively adjusting the scanning activity in a two-way radio transceiver comprising the steps of:
   scanning a plurality of unweighted channels in order to detect qualified activity on a channel;
   marking a channel as a priority channel if a predetermined amount of qualified activity is present on the channel;
   switching the scanning process such that the marked channel is scanned at a higher rate than the unmarked channels in a weighted manner, the weighted manner providing a user selectable weighting of the scan of the priority channel;
   unmarking the priority channel if the priority channel has no qualified activity in a predetermined number of scanning cycles;
   switching the scanning process to remove the priority channel such that all unmarked channels are scanned in an unweighted manner; and adjusting the predetermined number of scan cycles based on the marking in order to prevent the occurrence of audio holes in the received audio on the two-way radio transceiver.

7. A method for adaptively adjusting the scanning activity in a two-way radio transceiver as in claim 6, further comprising the step of:

adjusting the threshold of qualified activity based upon the duration of detected channel activity.

8. A method for adaptively adjusting the scanning activity in a two-way radio transceiver as in claim 6, comprising the step of:

adjusting the manner in which the priority channel is weighted for controlling the rate upon which channels that are not marked are scanned.

\* \* \* \* \*

UNITED STATES PATENT AND TRADEMARK OFFICE
CERTIFICATE OF CORRECTION

PATENT NO. : 8,374,603 B2  Page 1 of 1
APPLICATION NO. : 11/380904
DATED : February 12, 2013
INVENTOR(S) : Klein et al.

It is certified that error appears in the above-identified patent and that said Letters Patent is hereby corrected as shown below:

On the title page, in item (56), under "FOREIGN PATENT DOCUMENTS", in Column 1, Line 2, delete "11/2007" and insert -- 10/2008 --, therefor.

Signed and Sealed this
Twenty-fourth Day of February, 2015

Michelle K. Lee
*Deputy Director of the United States Patent and Trademark Office*